United States Patent
Hung et al.

(10) Patent No.: US 9,159,412 B1
(45) Date of Patent: Oct. 13, 2015

(54) STAGGERED WRITE AND VERIFY FOR PHASE CHANGE MEMORY

(71) Applicant: Macronix International Co., Ltd., Hsinchu (TW)

(72) Inventors: Chun-Hsiung Hung, Hsinchu (TW); Tien-Yen Wang, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/331,487

(22) Filed: Jul. 15, 2014

(51) Int. Cl.
*G11C 11/34* (2006.01)
*G11C 13/00* (2006.01)

(52) U.S. Cl.
CPC ........ *G11C 13/0064* (2013.01); *G11C 13/0004* (2013.01); *G11C 13/0069* (2013.01); *G11C 2013/0066* (2013.01)

(58) Field of Classification Search
CPC ........... G11C 16/3454; G11C 16/3459; G11C 11/5628
USPC .............................. 365/185.22, 148, 163, 158
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,335,202 A * | 8/1994 | Manning et al. | 365/222 |
| 5,515,488 A | 5/1996 | Hoppe et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |

(Continued)

FOREIGN PATENT DOCUMENTS

| | | |
|---|---|---|
| WO | 00/79539 | 12/2000 |
| WO | 01/45108 | 6/2001 |
| WO | 2004025659 A1 | 3/2004 |

OTHER PUBLICATIONS

"Magnetic Bit Boost," www.sciencenews.org <http://www.sciencenews.org>, Dec. 18 & 25, 2004, p. 389, vol. 166.

(Continued)

*Primary Examiner* — Son Dinh
(74) *Attorney, Agent, or Firm* — Yiding Wu; Haynes Beffel & Wolfeld LLP

(57) ABSTRACT

A method for storing a data value in a memory cell is provided. The data value includes one of a first data value and a second data value respectively represented by a first and a second programmable resistance ranges. The method includes, within a write cycle, storing the first data value in the memory cell by applying a first verify operation having a first verify period and a first write operation having a first write period, or storing the second data value in the memory cell by applying a second verify operation having a second verify period longer than the first verify period and a second write operation having a second write period shorter than the first write period. The write cycle is shorter than a sum of the first write period and the second verify period.

16 Claims, 8 Drawing Sheets

(56) References Cited

U.S. PATENT DOCUMENTS

| | | |
|---|---|---|
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,335,881 B2 * | 1/2002 | Kim et al. ............. 365/185.18 |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi |
| 6,815,704 B1 | 11/2004 | Chen |
| 6,830,952 B2 | 12/2004 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung |
| 7,042,001 B2 | 5/2006 | Kim et al. |
| 7,067,865 B2 | 6/2006 | Lung |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 7,701,759 B2 | 4/2010 | Lung et al. |
| 8,508,998 B2 * | 8/2013 | Haukness ............. 365/185.17 |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0217253 A1 | 9/2007 | Kim et al. |
| 2008/0180990 A1 | 7/2008 | Lung |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4 pp.

(56) References Cited

OTHER PUBLICATIONS

"Remembering on the Cheap," www.sciencenews.org <http://www.sciencenews.org>, Mar. 19, 2005, p. 189, vol. 167.

"Thermal Conductivity of Crystalline Dielectrics" in CRC Handbook of Chemistry and Physics, Internet Version 2007, (87.sup.th edition), David R. Lide, ed. Taylor and Francis, Boca Raton, FL.

Adler, D. et al., "Threshold Switching in Chalgenid-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "Highly Reliable 5nm Contact Cell Technology for 256Mb PRAM," VLSI Technology, Digest of Technical Papers, Jun. 14-16, 2005, pp. 98-99.

Ahn, S.J. et al., "A Highly Manufacturable High Density Phase Change Memory og 64 Mb and Beyond," IEEE IEDM Dec. 13-14, 2004, pp. 907-910.

Axon Technologies Corporation paper: Technology Description, Dec. 1997, pp. 1-6.

Bedeschi, F. et al., "4-MB MOSFET-Selected Phase-Change Memory Experimental Chip," IEEE, Sep. 21-23, 2004, 4 pp.

Blake thesis, "Investigation of GeTeSb5 Chalcogenide Films for Use as an Analog Memory," AFIT/GE/ENG/00M-04, Mar. 2000 121 pages.

Chao, D-S. et al., "Low Programming Current Phase Change Memory Cell with Double gst Thermally Confined Structure," VLSI-TSA 2007, International symposium Apr. 23-25, 2007, 2pp.

Chen, et al., "Non-Volatile Resistive Switching for Advanced Memory Applications," IEEE IEDM, Dec. 5-7, 2005, 4 pp.

Cho, S.L. et al., "Highly Scalable On-axis Confined Cell Structure for High Density PRAM beyond 256Mb," 2005 Symposium on VLSI Technology Digest of Technical Papers, Jun. 14-16, 2005, pp. 96-97.

Gibson, G.A. et al., "Phase-change Recording Medium that Enables Ultrahigh-density Electron-beam Data Storage," Applied Physics Letter, Jan. 25, 2005, 3 pp., vol. 86.

Gill, Manzur et al., "A High-Performance Nonvolatile Memory Technology for Stand-Alone Memory and Embedded Applications," Feb. 7, 2002 2002 IEEE-ISSCC Technical Digest (TD 12.4), 7 pp.

Ha, Y.H. et al., "An Edge Contact Type Cell from Phase Change RAM Featuring Very Low Power Consumption," 2003 Symposium on VSLI Technology Digest of Technical Papers, Jun. 10-12, 2003, pp. 175-176.

Happ, T.D. et al., "Novel One-Mask Self-Heating Pillar Phase Change Memory," 2006 Symposium on VLSI Technology, Jun. 13-15, 2006, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, Jun. 10-12, 2003, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-Change RAM Based on 0.24 .mu.m-CMOS Technologies," 2003 Symposium on VLSI Technology Digest of Technical Papers, Jun. 10-12, 2003, pp. 173-174.

Iwasaki, Hiroko et al, "completely Erasable Phase Change Optical Disk," Jpn. J. Appl. Phys., Feb. 1992, pp. 461-465, vol. 31.

Jeong, C.W. et al., "Switching Current Scaling and Reliability Evaluation in PRAM," IEEE Non-Volatile Semiconductor Memory Workshop, Monterey, CA, Aug. 22-26, 2004, pp. 28-29 and workshop cover sheet.

Kim, Kinam et al., "Reliability Investigations for Manufacturable High Density PRAM," IEEE 43.sup.rd Annual International Reliability Physics Symposium, San Jose, Apr. 17-21, 2005, pp. 157-162.

Kojima, Rie et al., "Ge—Sn—Sb—Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 8-10, 2003, pp. 255-258.

Lai, Stephan et al., OUM-A 180 nm Nonvolatile Memory Cell Element Technology for Stand Alone and Embedded Applications, IEEE IEDM Dec. 2-5, 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel .mu.Trench Phase-Change Memory Cell for Embedded and Stand-Alone Non-Volatile Memory Applications," 2004 Symposium on VLSI Technology Digest of Technical Papers, Jun. 15-17, 2004, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 7, 2002.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

Strauss, Karl F. et al., "Overview of Radiation Tolerant Unlimited Write Cycle Non-Volatile Memory," IEEE 2000 Aerospace Conf. Proc., vol. 7, Mar. 25, 2000, pp. 399,408.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy C., Nonvolatile high-density high-performance phase-change memory. Proc. SPIE 3891, Electronics and Structures for MEMS, 2 (Sep. 29, 1999), 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM Dec. 8-10, 2003, 4 pages.

\* cited by examiner

STAGGERED WRITE AND VERIFY FOR PHASE CHANGE MEMORY

BACKGROUND

1. Field of the Invention

The present application relates to programmable resistance memory, including phase change memory, and more particularly to a write cycle for a memory device.

2. Description of Related Art

In a phase change memory and other programmable resistance memory, to write a data value represented by a resistance range to a memory cell, a sequence of alternating verify operations and write operation can be applied to the memory cell. A phase change memory can be a bit-alternative memory, where a verify operation and a write operation to set a first memory cell to a first resistance range can be in the same write cycle as a second verify operation and a second write operation to set a second memory cell to a second resistance range. To write two data values represented by two different resistance ranges to two memory cells, verify operations on the two memory cells can both start at an initial time, and subsequent write operations on the two memory cells can both start at a second time, in the same write cycle. However, depending on the data value, a verify operation is either longer or shorter than a write operation. Consequently, a longer write operation after a shorter verify operation on a first memory cell waits for a longer verify operation on a second memory cell to end before the longer write operation on the first memory cell can start. Similarly, the longer verify operation after the shorter write operation on the second memory cell waits for the longer write operation on the first memory cell to end before the longer write operation for the second memory cell can start. Such waiting degrades the overall memory performance.

It is desirable to provide a method to improve the overall memory performance when writing data values represented by different resistance ranges in the same write cycles.

SUMMARY

A method for storing a data value in a memory cell is provided. The memory cell can be in a memory, such as a phase change memory where a plurality of memory cells stores data values represented by different programmable resistance ranges. The data value includes one of a first data value and a second data value respectively represented by a first and a second programmable resistance ranges.

One embodiment described herein includes, within a write cycle, storing the first data value in the memory cell by applying a first verify operation having a first verify period and a first write operation having a first write period, or storing the second data value in the memory cell by applying a second verify operation having a second verify period longer than the first verify period and a second write operation having a second write period shorter than the first write period. The write cycle is shorter than a sum of the first write period and the second verify period.

The first verify period starts after an initial time of the write cycle and ends after a first time delay. The first write period starts after a second time delay and ends before a final time delay. The second verify period starts after the initial time and ends after a third time delay longer than the second time delay. The second write period starts after a fourth time delay and ends before the final time delay.

The first verify period and the first write period are dependent on the first programmable resistance range. The second verify period and the second write period are dependent on the second programmable resistance range.

The plurality of memory cells, including a first memory cell, is coupled to a plurality of bit lines, where the first verify operation and the first write operation can be applied to the first memory cell via a first bit line in the plurality of bit lines and coupled to the memory cell. During the write cycle when the first data value is stored in the first memory cell, the second data value can be stored in a second memory cell in the plurality of memory cells via a second bit line in the plurality of bit lines by applying a second verify operation having the second verify period and a second write operation having the second write period.

Resistance values in the first resistance range can be lower than resistance values in the second resistance range, and the first write operation can have a voltage amplitude lower than a voltage amplitude of the second write operation and higher than a voltage amplitude of the first verify operation and the second verify operation.

In an alternative embodiment described herein, the first write period starts after an initial time of the write cycle and ends after a third time delay. The first verify period starts after a fourth time delay and ends before a final time delay. The second write period starts after the initial time and ends after a first time delay. The second verify period starts after a second time delay shorter than the third time delay and ends before the final time delay.

A memory device is also described configured to execute the methods described herein.

Other aspects and advantages of the present invention can be seen on review of the drawings, the detailed description and the claims, which follow.

DETAILED DESCRIPTION

Figure 1:
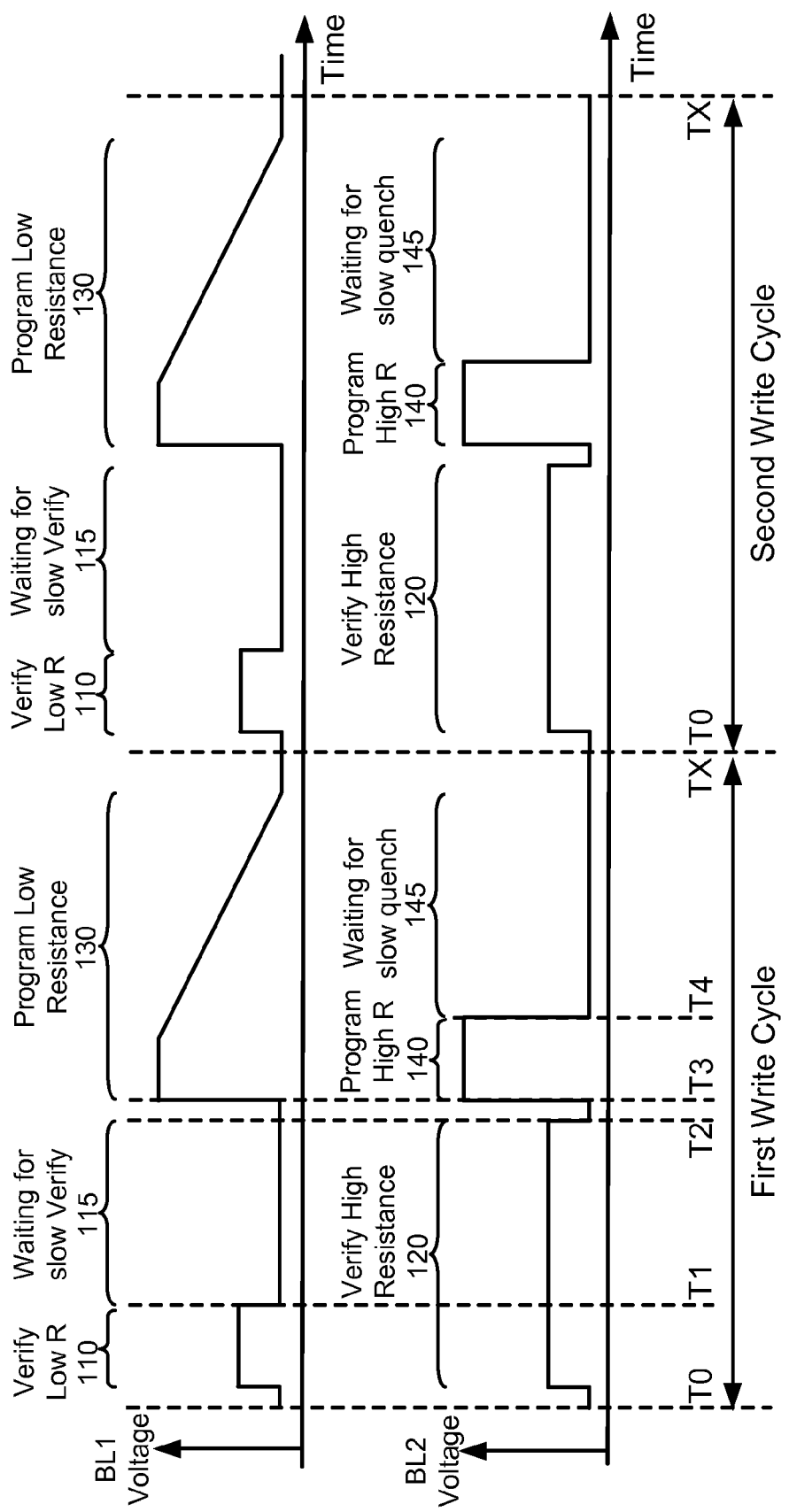
FIG. 1 is a waveform diagram illustrating using waiting time between verify and write operations when writing data values represented by programmable resistance ranges.

A detailed description of various embodiments is described with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a waveform diagram illustrating using waiting time between verify and write operations when writing data values represented by programmable resistance ranges. In FIG. 1, a first sequence of alternating verify operations and write operations for writing a data value represented by a first programmable resistance range (e.g. low resistance) is illustrated by waveforms applied to a first bit line (BL1 voltage). A second sequence of alternating verify operations and write operations for writing a data value represented by a second programmable resistance range (e.g. high resistance) is illustrated by waveforms applied to a second bit line (BL2 voltage). A verify operation verifies whether a memory cell is set to an expected resistance range. If the memory cell is not set to an expected resistance range, a subsequent write operation is applied.

In a bit alternative memory, such as a phase change memory, a memory cell can be written to a data value represented by a low resistance, while another memory cell can be written to another data value represented by a high resistance, in a write cycle. For each of the data values, the write cycle can include a verify operation followed by a write operation. Depending on the data value, a verify operation is either longer or shorter than a write operation.

The verify operation for high resistance can be slower than the verify operation for low resistance because of lower cell current associated with high resistance than with low resistance. For phase change memory, the write operation for high resistance is faster than the write operation for low resistance because of faster quench time associated with high resistance than with low resistance.

As illustrated in FIG. 1, in a first write cycle, to write a data value represented by a low resistance, a shorter verify operation 110 is followed by a longer write operation 130 with a first waiting time 115 in between, while to write a data value represented by a high resistance, a longer verify operation 120 is followed by a shorter write operation 140 with a second waiting time 145 after the shorter write operation 140.

The shorter verify operation 110 and the longer verify operation 120 both start after an initial time T0 of the first write cycle. The shorter verify operation 110 ends at a first time delay T1, before the longer verify operation 120 ends at a second time delay T2. The longer write operation 130 waits through the first waiting time 115 for the longer verify operation 120 to end.

The longer write operation 130 and the shorter write operation 140 then both start after a third time delay T3. The longer write operation 130 ends before a final time delay TX. The shorter write operation 140 ends at a fourth time delay T4, before the longer write operation 130 ends. The next longer verify operation 120 for writing a data value represented by a high resistance waits through the second waiting time 145 in the first write cycle, and starts after the final time delay TX of the first write cycle or the initial time T0 of the second write cycle.

Consequently, the final time delay TX is equal to or greater than the sum of the longer write operation 130 and the longer verify operation 120.

Figure 2:
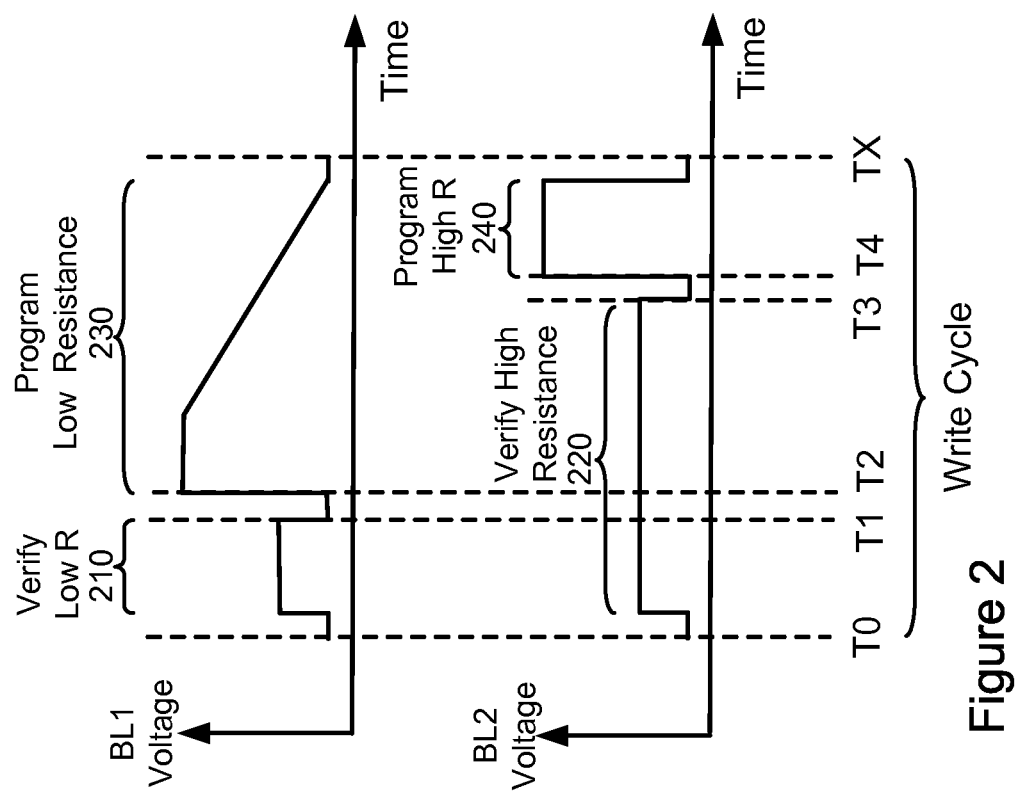
FIG. 2 is a waveform diagram illustrating an implementation of a method for writing a data value to a memory cell, where the data value is represented by first and second programmable resistance ranges.

FIG. 2 is a waveform diagram illustrating an implementation of a method for writing a data value to a memory cell, where the data value is represented by first and second programmable resistance ranges. For instance, the first resistance range can have resistance values lower than resistance values in the second resistance range. The data value is written in a write cycle. The write cycle includes a first sequence of alternating verify operations and write operations for writing a first data value represented by the first programmable resistance range, and a second sequence of alternating verify operations and write operations for writing a second data value represented by the second programmable resistance range. A verify operation is applied after a write operation. If the verify operation determines that the memory cell is not set to an expected resistance range by the previous write operation, another write operation is then applied. First and second verify operations, and first and second write operations as referred to in FIG. 2 are examples for operations in the first and second sequences of operations.

As illustrated in the example of FIG. 2, the write cycle starts at an initial time (e.g. T0) and ends at a final time delay (e.g. TX). To write a first data value represented by the first resistance range (e.g. Low Resistance or Low R), a first verify operation (e.g. 210) is applied to the memory cell. The first verify operation has a first verify period. The first verify period starts after the initial time (e.g. T0) and ends after a first time delay (e.g. T1). A first write operation (e.g. 230) is subsequently applied to the memory cell. The first write operation has a first write period. The first write period starts after a second time delay (e.g. T2) and ends before the final time delay (e.g. TX).

To write a second data value represented by the second resistance range (e.g. High Resistance or High R) in parallel to a second memory cell, a second verify operation is applied to the second memory cell (e.g. 220). The second verify operation has a second verify period longer than the first verify period. The second verify period starts after the initial time (e.g. T0) and ends after a third time delay (e.g. T3) longer than the second time delay (e.g. T2). A second write operation is subsequently applied to the second memory cell (e.g. 240). The second write operation has a second write period shorter than the first write period. The second write period starts after a fourth time delay (e.g. T4) and ends before the final time delay (e.g. TX). Consequently, the method as illustrated in the example of FIG. 2 does not use the first and second waiting times (e.g. 115, 145) as in the method as illustrated in FIG. 1.

In this implementation of the method, the final time delay is shorter than the sum of the first write period and the second verify period. In comparison, the write cycle described in connection with FIG. 1 is equal to or greater than the sum of the longer write operation and the longer verify operation. Consequently, the method described in connection with FIG. 2 can shorten the write cycle, and improve operating speed of the memory device.

As illustrated in the example of FIG. 2, the first and second write operations for writing the data value represented by the first and second programmable resistance ranges can have a same voltage amplitude. In an alternative implementation, the first write operation for programming low resistance (e.g. 230) can have a voltage amplitude lower than a voltage amplitude of the second write operation for programming high resistance (e.g. 240) and higher than a voltage amplitude of the first verify operation and the second verify operation (e.g. 210, 220).

The plurality of memory cells in the memory are coupled to a plurality of bit lines. Within a write cycle, the first verify operation and the first write operation can be applied to a first memory cell via a first bit line in the plurality of bit lines and coupled to the first memory cell, while the second verify operation and the second write operation can be applied in parallel to a second memory cell via a second bit line in the plurality of bit lines and coupled to the second memory cell.

Figure 3:
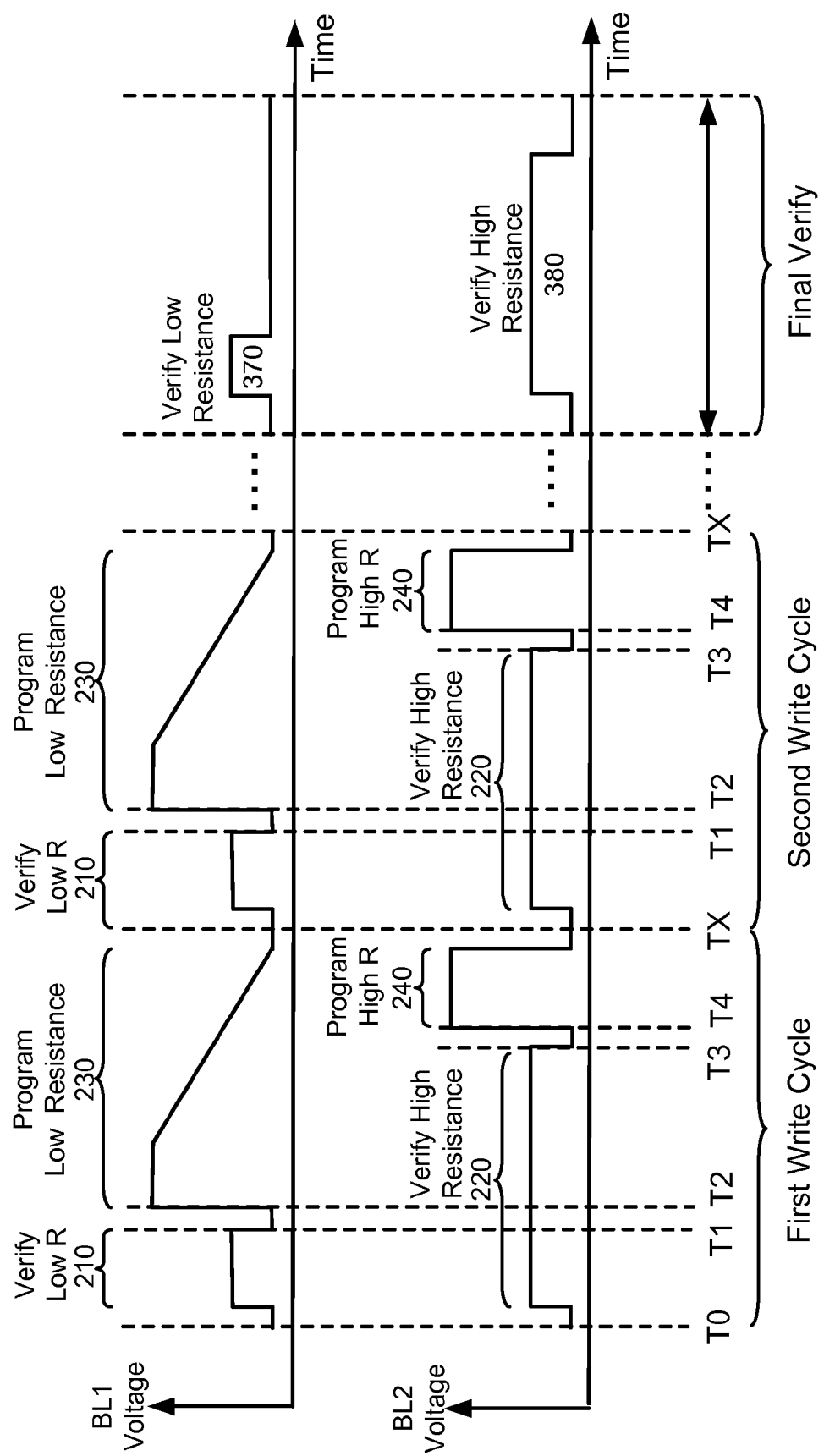
FIG. 3 is a waveform diagram illustrating first and second sequences of operations for writing data values represented by first and second programmable resistance ranges.

FIG. 3 is a waveform diagram illustrating a first sequence of alternating verify operations and write operations for writing a first data value represented by the first programmable resistance range, and a second sequence of alternating verify operations and write operations for writing a second data value represented by the second programmable resistance range. Waveforms for voltage applied to a first bit line (BL1 voltage) correspond to the first sequence. Waveforms for voltage applied to a second bit line (BL2 voltage) correspond to the second sequence. Verify operations and write operations in the first and second sequences are as described in connection with FIG. 2. The first and second write cycles are examples for more write cycles in the first and second sequences.

A verify operation verifies whether a memory cell is set to an expected resistance range. If the memory cell is not set to an expected resistance range, a subsequent write operation is applied, until the memory cell is in the expected resistance range or until a pre-determined number of verify/write operations has been executed. When memory cells in a byte (e.g. 8 bits), a word (e.g. 16 bits), a page (e.g. multiple words), or up to a full memory device have either been set to the expected resistance ranges or have reached the pre-determined number of verify/write operations, a final verify is executed to verify the memory cells that are expected to be set to the first resistance range (e.g. 370, low resistance) or the second resistance range (e.g. 380, high resistance). Results from the final verify can be used for specification about data retention of the memory device.

Figure 4:
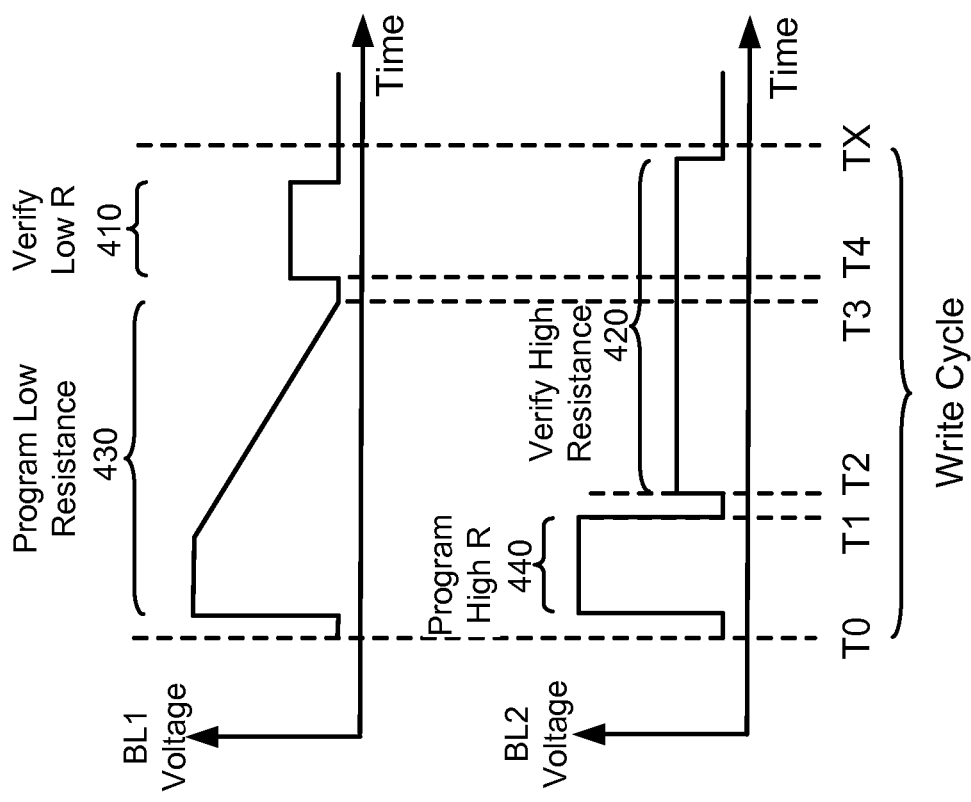
FIG. 4 is a waveform diagram illustrating an alternative implementation of a method for writing a data value to a memory cell, where the data value is represented by first and second programmable resistance ranges.

FIG. 4 is a waveform diagram illustrating an alternative implementation of a method for writing a data value to a memory cell, where the data value is represented by first and second programmable resistance ranges. The alternative implementation can be used in an application where a write operation can be executed before a verify operation. For instance, a first write operation to write a first data value represented by the first resistance range to a first memory cell, and/or a second write operation to write a second data value represented by the second resistance range to a second memory cell, can be applied after an initial time in a write cycle, before any verify operations are applied in the write cycle.

As illustrated in the example of FIG. 4, the write cycle starts at an initial time (e.g. T0) and ends at a final time delay (e.g. TX). To write a first data value represented by the first resistance range (e.g. Low Resistance or Low R) to the memory cell, a first write operation is applied to the first memory cell (e.g. 430). The first write operation has a first write period. The first write period starts after the initial time (e.g. T0) and ends after a third time delay (e.g. T3). A first verify operation (e.g. 410) is subsequently applied to the memory cell. The first verify operation has a first verify period. The first verify period starts after a fourth time delay (e.g. T4) and ends before the final time delay (e.g. TX). Between the first write operation and the first verify operation, there can be a minimum setup time required for the first verify operation.

To write a second data value represented by the second resistance range (e.g. High Resistance or High R) in parallel to a second memory cell, a second write operation (e.g. 440) is applied to the second memory cell. The second write operation has a second write period shorter than the first write period. The second write period starts after the initial time (e.g. T0) and ends after a first time delay (e.g. T1). A second verify operation (e.g. 420) is subsequently applied to the memory cell. The second verify operation has a second verify period longer than the first verify period. The second verify period starts after a second time delay (e.g. T2) shorter than the third time delay and ends before the final time delay (e.g. TX). Between the second write operation and the second verify operation, there can be a minimum setup time required for the second verify operation.

In this implementation, the first and second write operations for writing the data value represented by the first and second programmable resistance ranges can have a same voltage amplitude. The final time delay is shorter than the sum of the first write period and the second verify period. Consequently, the method described in connection with FIG. 4 can shorten the write cycle, and improve operating speed of the memory device, in comparison to the method described in connection with FIG. 1.

Figure 5:
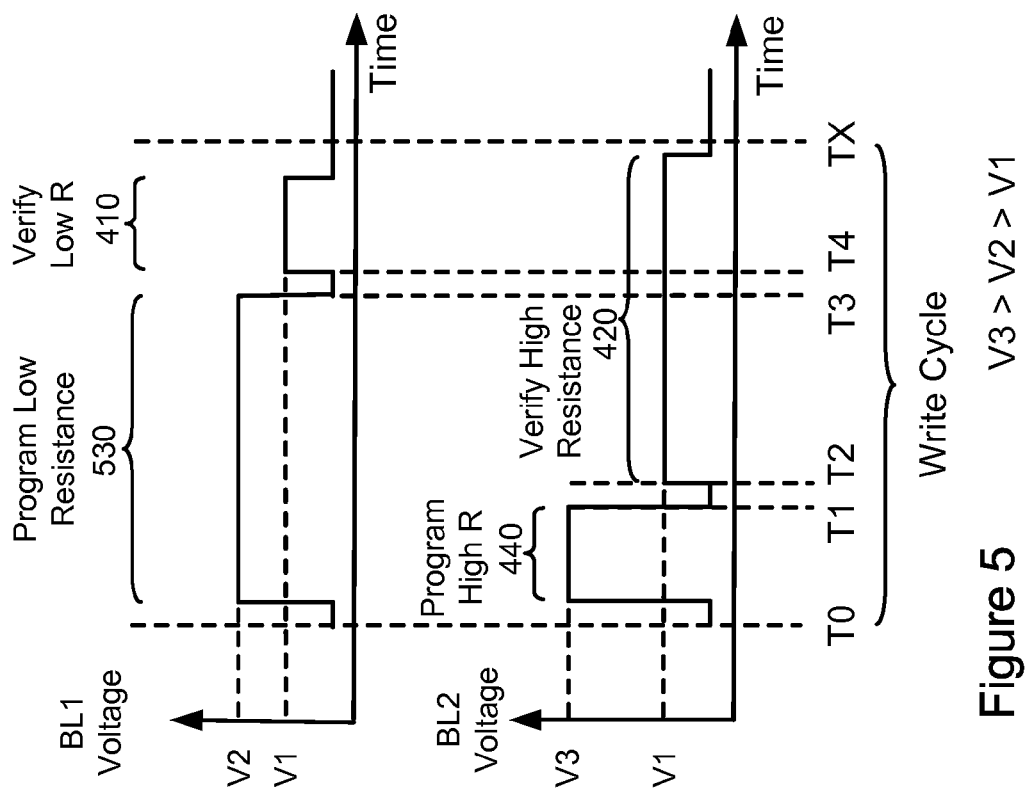
FIG. 5 is a waveform diagram illustrating an alternative implementation of a method for writing a data value to a memory cell, where write operations for writing the data value represented by the first and second programmable resistance ranges can have different voltage amplitudes.

FIG. 5 is a waveform diagram illustrating an alternative implementation of a method for writing a data value to a memory cell, where write operations for writing the data value represented by the first and second programmable resistance ranges can have different voltage amplitudes. Like elements in FIG. 5 are referred to with like reference numerals in FIG. 4.

In the example shown in FIG. 5, to write a first data value represented by the first resistance range (e.g. Low Resistance or Low R), a first write operation (e.g. 530) is applied to the memory cell. The first write operation has a first write period longer than the second write period of the second write operation (e.g. 440). The first write period starts after the initial time (e.g. T0) and ends after a third time delay (e.g. T3) longer than the second time delay (e.g. T2). A first verify operation (e.g. 410) is subsequently applied to the memory cell. The first verify operation has a first verify period shorter than the second verify period of the second verify operation (e.g. 420). The first verify period starts after a fourth time delay (e.g. T4) and ends before the final time delay (e.g. TX). Between the first write operation and the first verify operation, there can be a minimum setup time required for the first verify operation.

As illustrated in the example of FIG. 5, the first write operation for programming low resistance (e.g. 530) has a voltage amplitude V2 lower than a voltage amplitude V3 of the second write operation for programming high resistance (e.g. 440) and higher than a voltage amplitude V1 of the first verify operation and the second verify operation (e.g. 420, 410). For instance, voltage amplitudes V1, V2 and V3 can be 0.4V, 2V and 2.5V, respectively. In comparison, the voltage amplitude for programming low resistance and the voltage amplitude for programming high resistance in the embodiments illustrated by FIGS. 2-4 can be the same, for example, at 2.5V. The voltage amplitude of the verify operations in the embodiments illustrated by FIGS. 2-4 can be at 0.4V.

Figure 6:
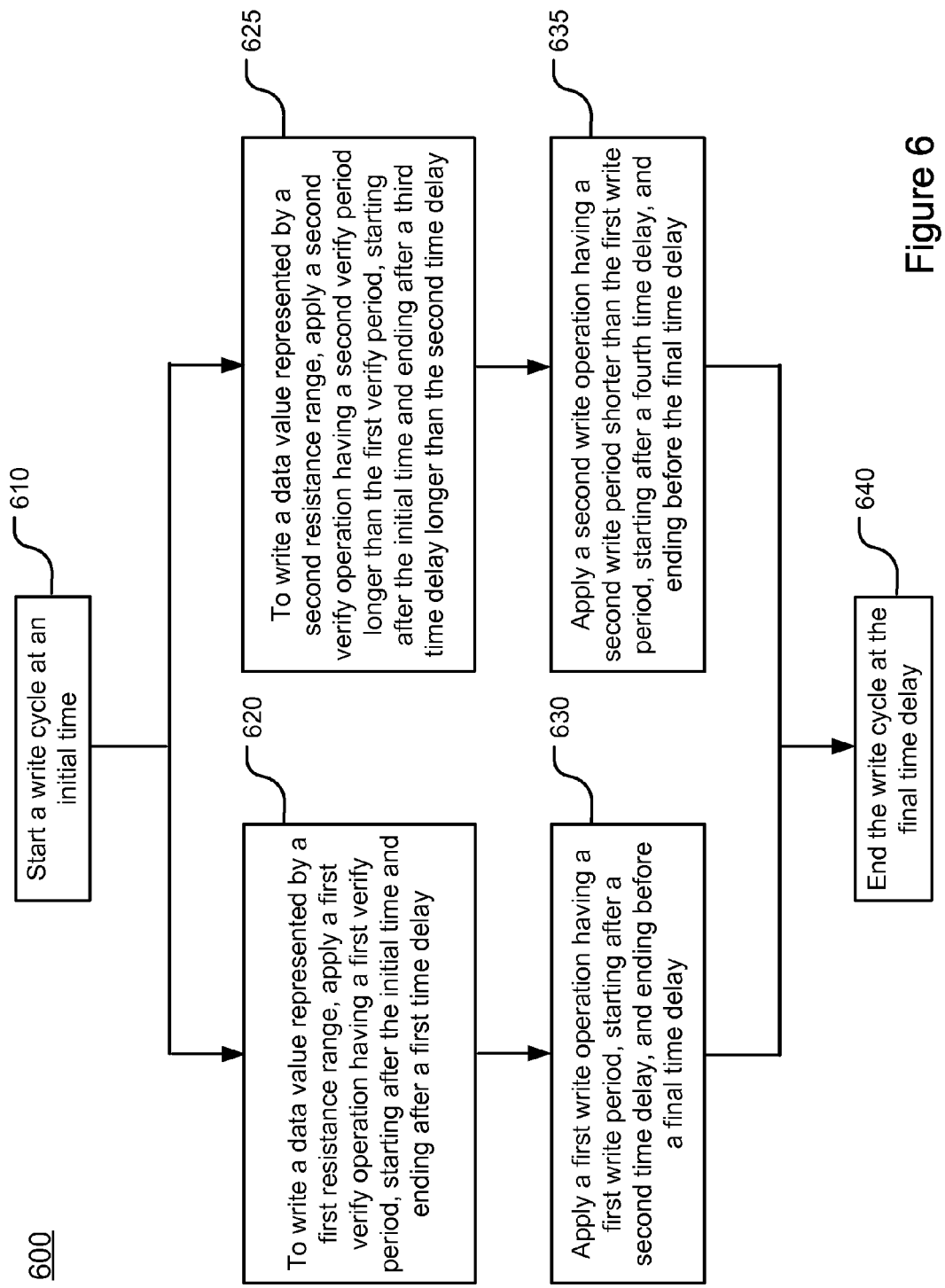
FIG. 6 is a flowchart illustrating an implementation of a method for writing a data value to a memory cell, where the data value is represented by first and second programmable resistance ranges.

FIG. 6 is a flowchart illustrating an implementation of a method for writing a data value to a memory cell, where the data value is represented by first and second programmable resistance ranges. For instance, the first resistance range can have resistance values lower than resistance values in the second resistance range. The data value is written in a write cycle. The write cycle starts at an initial time (Step 610), and ends at a final time delay (Step 640).

To write a first data value represented by the first resistance range, a first verify operation is applied to the memory cell (Step 620). The first verify operation has a first verify period, and the first verify period starts after an initial time of a write cycle and ends after a first time delay. A first write operation is subsequently applied to the memory cell (Step 630). The first write operation has a first write period, and the first write period starts after a second time delay and ends before a final time delay.

To write a second data value represented by the second resistance range, a second verify operation is applied (Step 625). The second verify operation has a second verify period longer than the first verify period. The second verify period starts after the initial time and ends after a third time delay longer than the second time delay. A second write operation is subsequently applied to the memory cell (Step 635). The second write operation has a second write period shorter than the first write period. The second write period starts after a fourth time delay and ends before the final time delay.

In this implementation of the method, the final time delay is shorter than the sum of the first write period and the second verify period.

A first data value represented by the first resistance range can be written to a first memory cell, while a second data value represented by the second resistance range can be written in parallel to a second memory cell, in a same write cycle. The initial time and the final time delay of the write cycle are the same for writing data values represented by the first and second resistance ranges to the first memory cell and the second memory cell, respectively.

Figure 7:
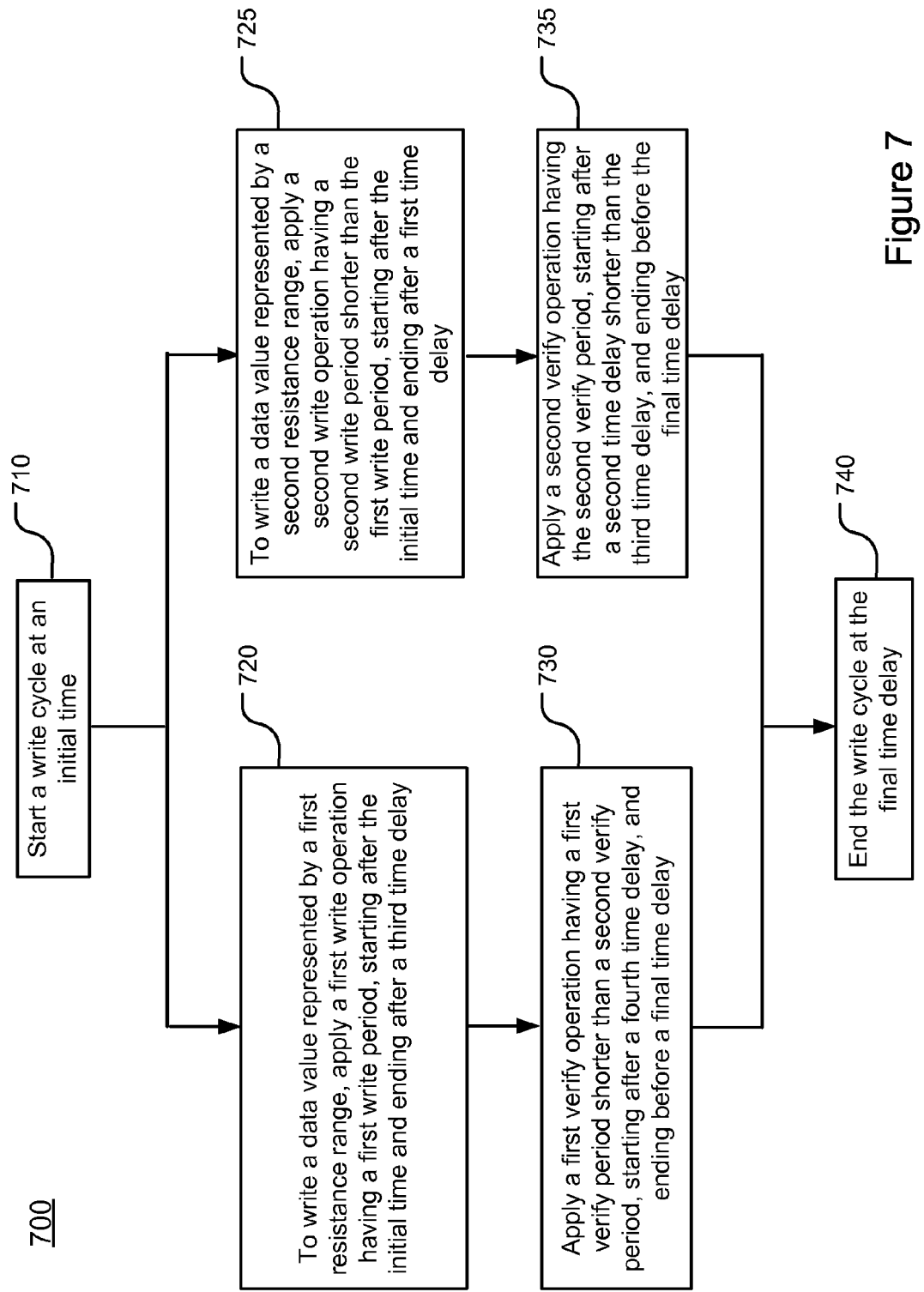
FIG. 7 is a flowchart illustrating an alternative implementation of the method for writing a data value to a memory cell, where the data value is represented by first and second programmable resistance ranges.

FIG. 7 is a flowchart illustrating an alternative implementation of the method for writing a data value to a memory cell, where the data value is represented by first and second programmable resistance ranges. The data value is written in a write cycle. The write cycle starts at an initial time (Step 710), and ends at a final time delay (Step 740).

To write a first data value represented by the first resistance range, a first write operation is applied (Step 720). The first write operation has a first write period longer than the second write period of the second write operation (e.g. 440, FIG. 4). The first write period starts after the initial time and ends after a third time delay longer than a second time delay. A first verify operation is subsequently applied (Step 730). The first verify operation has a first verify period shorter than the second verify period of the second verify operation (e.g. 420, FIG. 4). The first verify period starts after a fourth time delay and ends before the final time delay.

To write a second data value represented by the second resistance range, a second write operation is applied. The second write operation has a second write period, and the second write period starts after the initial time of the write cycle and ends after a first time delay (Step 725) shorter than the second time delay. A second verify operation is subsequently applied (Step 735). The second verify operation has a second verify period. The second verify period starts after the second time delay and ends before a final time delay.

In the alternative implementation of the method, the final time delay is shorter than the sum of the first write period and the second verify period.

Figure 8:
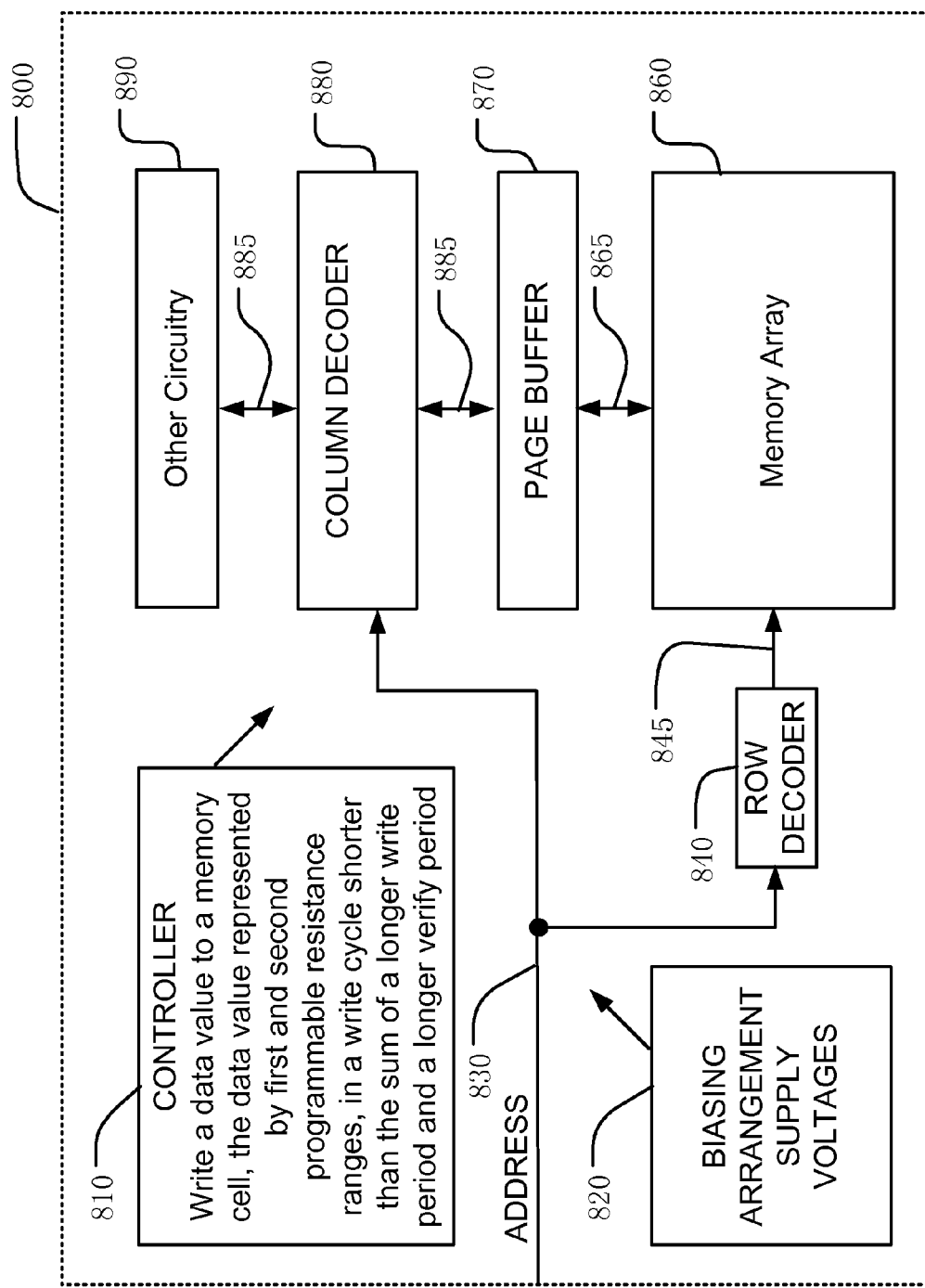
FIG. 8 is a simplified block diagram of an integrated circuit memory including a controller configured with logic to execute the method described herein.

FIG. 8 is a simplified block diagram of an integrated circuit memory including a controller 810 configured to implement a method for operating the integrated circuit memory 800. The controller 810 is coupled to the memory array 860. The method can include writing a data value to a memory cell, where the data value is represented by first and second programmable resistance ranges. To write a first data value represented by the first resistance range, a first verify operation and subsequently a first write operation are applied to the memory cell. The first verify operation has a first verify period, and the first verify period starts after an initial time of a write cycle and ends after a first time delay. The first write operation has a first write period, and the first write period starts after a second time delay and ends before a final time delay.

To write a second data value represented by the second resistance range, a second verify operation and subsequently a second write operation are applied. The second verify operation has a second verify period longer than the first verify period. The second verify period starts after the initial time and ends after a third time delay longer than the second time delay. The second write operation has a second write period shorter than the first write period, and the second write period starts after a fourth time delay and ends before the final time delay. The final time delay is shorter than the sum of the first write period and the second verify period.

In an alternative embodiment described herein, the method can include writing a first data value represented by the first resistance range by applying a first write operation having a first write period, and subsequently a first verify operation having a first verify period, and writing a second data value represented by the second resistance range by applying a second write operation having a second write period longer than the first write period, and subsequently a second verify operation having a second verify period shorter than the first verify period, such that the final time delay is shorter than the sum of the first verify period and the second write period.

The controller 810, implemented for example as a state machine, provides signals to control the application of bias arrangement supply voltages generated or provided through the voltage supply or supplies in block 820 to carry out the various operations described herein. These operations include read, write, and refresh operations. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

In some embodiments, the memory array 860 can include single levels of cells (SLC). In other embodiments, the memory array 860 can include multiple levels of cells (MLC). A row decoder 840 is coupled to a plurality of word lines 845 arranged along rows in the memory array 860. Column decoders in block 880 are coupled to a set of page buffers 870, in this example via data bus 875. Global bit lines 865 are coupled to local bit lines (not shown) arranged along columns in the memory array 860. Addresses are supplied on bus 830 to column decoders in block 880 and row decoder in block 840. Data is supplied via the line 885 from other circuitry 890 (including for example input/output ports) on the integrated circuit, such as a general purpose processor or special purpose application circuitry, or a combination of modules providing system-on-a-chip functionality supported by the memory array 860.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for storing a data value in a memory cell, the data value including one of a first data value and a second data value respectively represented by a first and a second programmable resistance ranges, comprising:
within a write cycle, storing the first data value in the memory cell by applying a first verify operation having a first verify period and a first write operation having a first write period, or storing the second data value in the memory cell by applying a second verify operation having a second verify period longer than the first verify period and a second write operation having a second write period shorter than the first write period,
wherein the write cycle is shorter than a sum of the first write period and the second verify period.

2. The method of claim 1, wherein the first verify period starts after an initial time of the write cycle and ends after a first time delay, the first write period starts after a second time delay and ends before a final time delay, the second verify period starts after the initial time and ends after a third time delay longer than the second time delay, and the second write period starts after a fourth time delay and ends before the final time delay.

3. The method of claim 1, wherein the first verify period and the first write period are dependent on the first programmable resistance range, and the second verify period and the second write period are dependent on the second programmable resistance range.

4. The method of claim 1, the memory comprising:
a plurality of memory cells, including said memory cell, coupled to a plurality of bit lines, wherein the first verify operation and the first write operation are applied to the memory cell via a first bit line in the plurality of bit lines and coupled to the memory cell.

5. The method of claim 4, including wherein during said write cycle, the first data value is stored in said memory cell, and during said write cycle, storing the second data value in a second memory cell in said plurality of memory cells via a second bit line in the plurality of bit lines by applying a second verify operation having said second verify period and a second write operation having said second write period.

6. The method of claim 1, wherein resistance values in the first resistance range are lower than resistance values in the second resistance range, and the first write operation has a voltage amplitude lower than a voltage amplitude of the second write operation and higher than a voltage amplitude of the first verify operation and the second verify operation.

7. The method of claim 1, wherein the first write period starts after an initial time of the write cycle and ends after a third time delay, the first verify period starts after a fourth time delay and ends before a final time delay, the second write period starts after the initial time and ends after a first time delay, and the second verify period starts after a second time delay shorter than the third time delay and ends before the final time delay.

8. A memory, comprising:
a plurality of memory cells storing data values being represented by first and second programmable resistance ranges; and
a controller coupled to the memory cells, including logic to write a data value to a memory cell in the plurality of memory cells, the logic includes:
to write a first data value represented by the first resistance range, logic to apply a first verify operation having a first verify period; and logic to apply a first write operation having a first write period; and
to write a second data value represented by the second resistance range, logic to apply a second verify operation having a second verify period longer than the first verify period; and logic to apply a second write operation having a second write period shorter than the first write period,
wherein a write cycle for writing one of the first and second data values is shorter than a sum of the first write period and the second verify period.

9. The memory of claim 8, wherein the first verify period starts after an initial time of the write cycle and ends after a first time delay, the first write period starts after a second time delay and ends before a final time delay, the second verify period starts after the initial time and ends after a third time delay longer than the second time delay, and the second write period starts after a fourth time delay and ends before the final time delay.

10. The memory of claim 8, wherein the first verify period and the first write period are dependent on the first programmable resistance range, and the second verify period and the second write period are dependent on the second programmable resistance range.

11. The memory of claim 8, the memory comprising:
a plurality of memory cells coupled to a plurality of bit lines, wherein the first verify operation and the first write operation are applied to the memory cell via a first bit line in the plurality of bit lines and coupled to the memory cell,
wherein the second verify operation and the second write operation are applied in parallel to a second memory cell via a second bit line in the plurality of bit lines and coupled to the second memory cell.

12. The memory of claim 8, wherein resistance values in the first resistance range are lower than resistance values in the second resistance range, and the first write operation has a voltage amplitude lower than a voltage amplitude of the second write operation and higher than a voltage amplitude of the first verify operation and the second verify operation.

13. A memory, comprising:
a plurality of memory cells storing data values being represented by first and second programmable resistance ranges; and
a controller coupled to the memory cells, including logic to write a data value to a memory cell in the plurality of memory cells, the logic includes:
to write a first data value represented by the first resistance range, logic to apply a first write operation having a first write period; and logic to apply a first verify operation having a first verify period; and
to write a second data value represented by the second resistance range, logic to apply a second write operation having a second write period shorter than the first write period; and logic to apply a second verify operation having a second verify period longer than the first verify period,
wherein a write cycle for writing one of the first and second data values is shorter than a sum of the first write period and the second verify period.

14. The memory of claim 13, wherein the first write period starts after an initial time of the write cycle and ends after a third time delay, the first verify period starts after a fourth time delay and ends before a final time delay, the second write period starts after the initial time and ends after a first time delay, and the second verify period starts after a second time delay shorter than the fourth time delay and ends before the final time delay.

15. The memory of claim 13, the memory comprising:
a plurality of memory cells coupled to a plurality of bit lines, wherein the first verify operation and the first write operation are applied to the memory cell via a first bit line in the plurality of bit lines and coupled to the memory cell,
wherein the second verify operation and the second write operation are applied in parallel to a second memory cell via a second bit line in the plurality of bit lines and coupled to the second memory cell.

16. The memory of claim 13, wherein resistance values in the first resistance range are lower than resistance values in the second resistance range, and the first write operation has a voltage amplitude lower than a voltage amplitude of the second write operation and higher than a voltage amplitude of the first verify operation and the second verify operation.

\* \* \* \* \*